United States Patent
Lee et al.

(10) Patent No.: US 9,165,876 B2
(45) Date of Patent: Oct. 20, 2015

(54) PACKAGE-ON-PACKAGE STRUCTURE AND METHODS FOR FORMING THE SAME

(71) Applicant: Taiwan Semiconductor Manufacturing Company, Ltd., Hsin-Chu (TW)

(72) Inventors: Chien-Hsun Lee, Chu-Tung Town (TW); Jung Wei Cheng, Hsin-Chu (TW); Hao-Cheng Hou, Hsin-Chu (TW); Tsung-Ding Wang, Tainan (TW); Jiun Yi Wu, Zhongli (TW); Ming-Chung Sung, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 13/874,821

(22) Filed: May 1, 2013

(65) Prior Publication Data
US 2014/0252609 A1    Sep. 11, 2014

Related U.S. Application Data

(60) Provisional application No. 61/776,747, filed on Mar. 11, 2013.

(51) Int. Cl.
*H01L 21/00* (2006.01)
*H01L 23/498* (2006.01)
(Continued)

(52) U.S. Cl.
CPC ...... *H01L 23/49816* (2013.01); *H01L 21/4853* (2013.01); *H01L 21/561* (2013.01); *H01L 21/565* (2013.01); *H01L 24/97* (2013.01); *H01L 25/105* (2013.01); *H01L 25/50* (2013.01); *H01L 23/3128* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32225* (2013.01); *H01L 2224/451* (2013.01); *H01L 2224/48091* (2013.01); *H01L 2224/48227* (2013.01); *H01L 2224/73204* (2013.01); *H01L 2224/73265* (2013.01); *H01L 2924/15192* (2013.01); *H01L 2924/15311* (2013.01); *H01L 2924/15331* (2013.01); *H01L 2924/1815* (2013.01)
(Continued)

(58) Field of Classification Search
CPC . H01L 23/49816; H01L 21/561; H01L 24/97; H01L 25/10; H01L 25/106; H01L 27/00; H01L 25/50; H01L 21/50; H01L 21/4853; H01L 2224/73204; H01L 2224/416225; H01L 2924/15
USPC ................ 438/106, 107, 108, 110, 51.64; 257/790, 686, 777, 778
See application file for complete search history.

(56) References Cited

U.S. PATENT DOCUMENTS 5,853,517 A * 12/1998 Petefish et al. ............... 156/196
6,184,062 B1 * 2/2001 Brofman et al. ............. 438/106
(Continued)

FOREIGN PATENT DOCUMENTS

| KR | 20100113676 | | 10/2010 | |
|---|---|---|---|---|
| KR | 1020110041181 | | 4/2011 | |
| KR | 101056747 | * | 8/2011 | .... H01L 2224/32225 |

*Primary Examiner* — Galina Yushina
(74) *Attorney, Agent, or Firm* — Slater & Matsil, L.L.P.

(57) ABSTRACT

A method includes coining solder balls of a bottom package, wherein top surfaces of the solder balls are flattened after the step of coining. The solder balls are molded in a molding material. The top surfaces of the solder balls are through trenches in the molding material.

20 Claims, 15 Drawing Sheets

(51) Int. Cl.
*H01L 21/56* (2006.01)
*H01L 25/10* (2006.01)
*H01L 25/00* (2006.01)
*H01L 21/48* (2006.01)
*H01L 23/00* (2006.01)
*H01L 23/31* (2006.01)

(52) U.S. Cl.
CPC .... *H01L 2224/97* (2013.01); *H01L 2225/1023* (2013.01); *H01L 2225/1058* (2013.01);

(56) References Cited

U.S. PATENT DOCUMENTS

| | | | |
|---|---|---|---|
| 6,627,997 B1* | 9/2003 | Eguchi et al. | 257/777 |
| 2007/0258683 A1* | 11/2007 | Rolston et al. | 385/88 |
| 2010/0078791 A1* | 4/2010 | Yim et al. | 257/686 |
| 2011/0089577 A1 | 4/2011 | Eom et al. | |

* cited by examiner

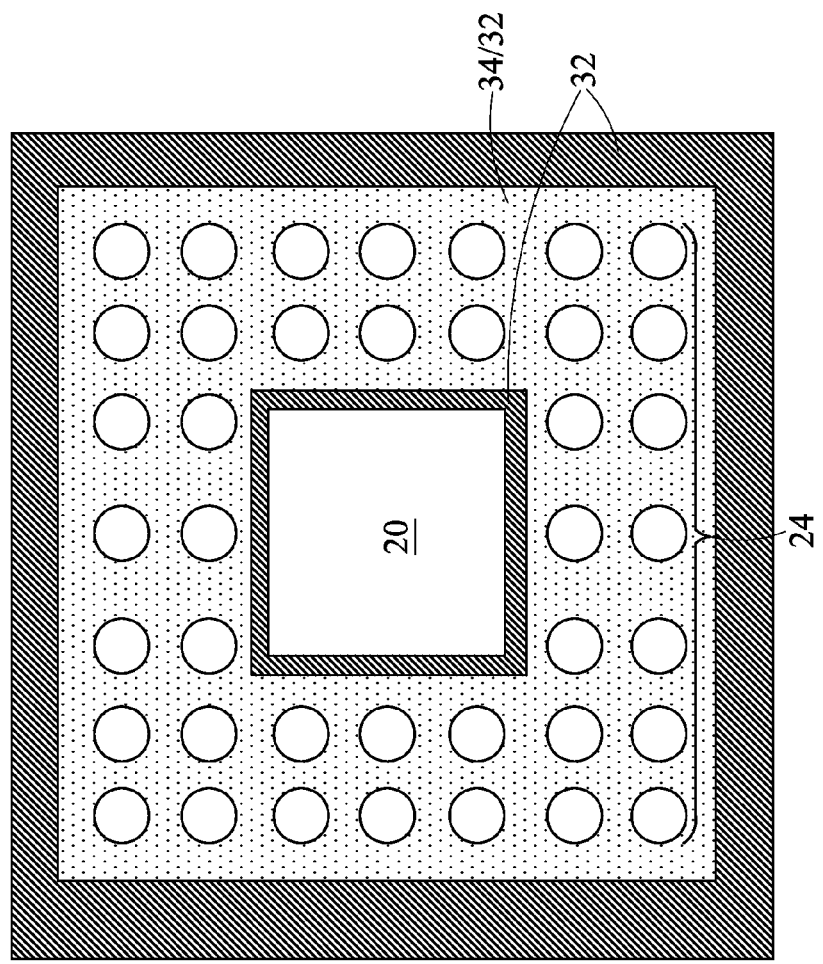

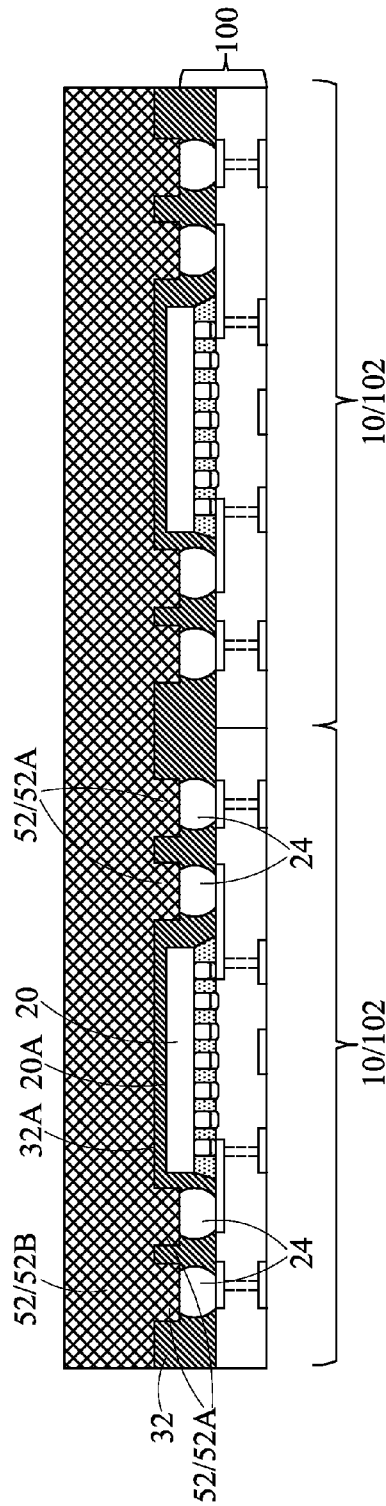
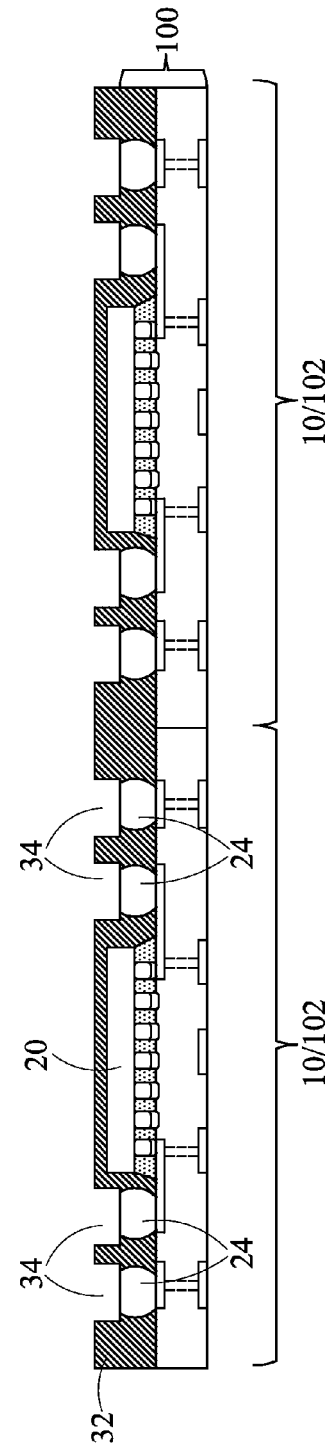
Fig. 11
Fig. 12

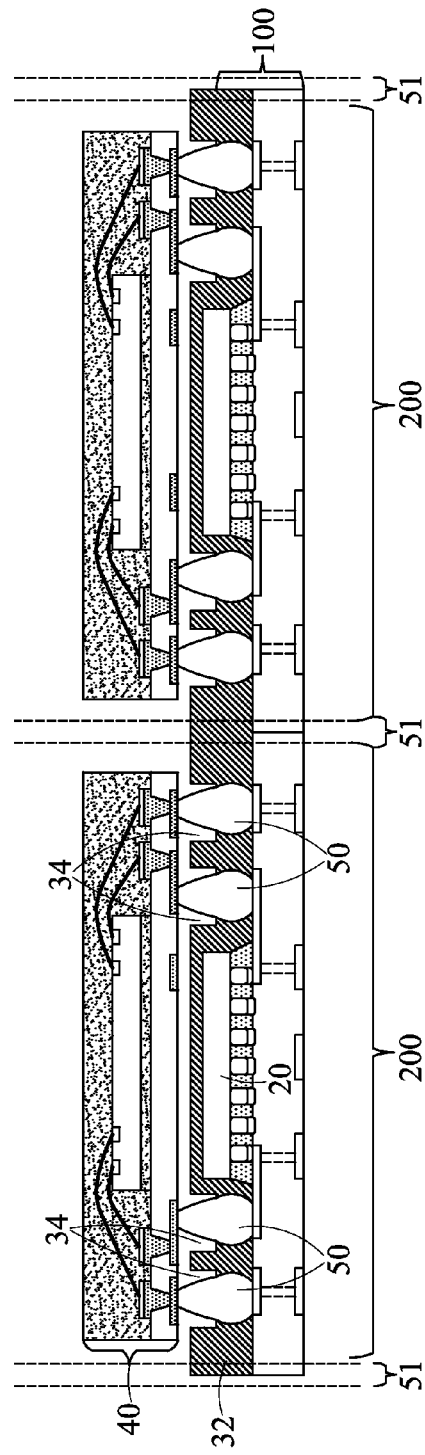
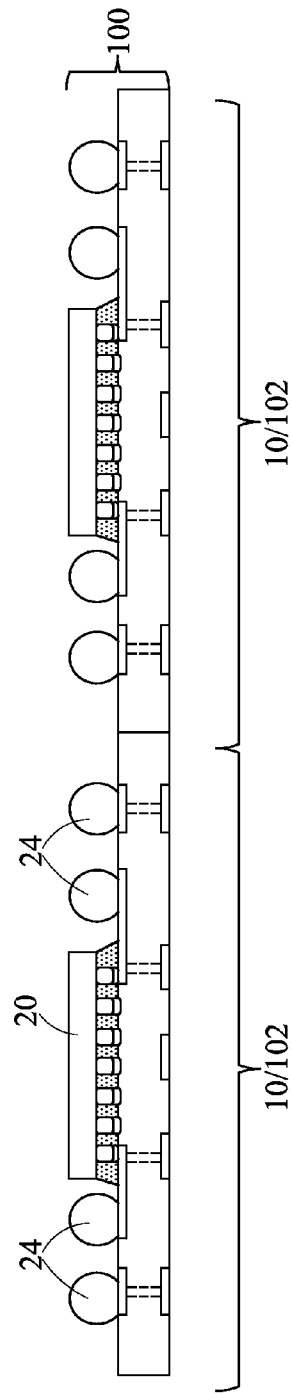
Fig. 13
Fig. 14

PACKAGE-ON-PACKAGE STRUCTURE AND METHODS FOR FORMING THE SAME

This application claims the benefit of the following provisionally filed U.S. patent application: Application Ser. No. 61/776,747, filed Mar. 11, 2013, and entitled "Package-on-Package Structure and Methods for Forming the Same," which application is hereby incorporated herein by reference.

BACKGROUND

In an existing Package-On-Package (PoP) packaging process, a bottom package is formed first, which comprises a device die bonded to a package substrate. A molding compound is then molded on the package substrate, wherein the device die is molded in the molding compound. The package substrate further comprises solder balls that are on the same side of the package substrate as the device die. The solder balls are used for connecting the bottom package to a top package. Through-molding openings are then formed in the molding compound, and hence the solder balls are exposed through the through-molding openings. In the formation of the through-molding openings, laser drill is used to remove portions of the molding compound that cover the connectors. The laser drilling is a low throughput process. Although the solder balls may be made large enough, so that the molding compound does not fully cover the solder balls, due to the large size of the solder balls, the pitch of the solder balls is also large. In addition, the stand-off height between the top package and the bottom package is also high.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 9 through 13 are cross-sectional views of intermediate stages in the manufacturing of a PoP structure in accordance with alternative embodiments, wherein a pin-type mold chase is used to coin solder balls;

FIGS. 14 through 18 are cross-sectional views of intermediate stages in the manufacturing of a PoP structure in accordance with yet alternative embodiments, wherein a trench-type mold chase is used to coin solder balls.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package and the method of forming the same are provided in accordance with various embodiments. The intermediate stages of forming the packages are illustrated in accordance with some embodiments. The variations of the embodiments are discussed. Throughout the various views and illustrative embodiments, like reference numbers are used to designate like elements.

Figure 1:
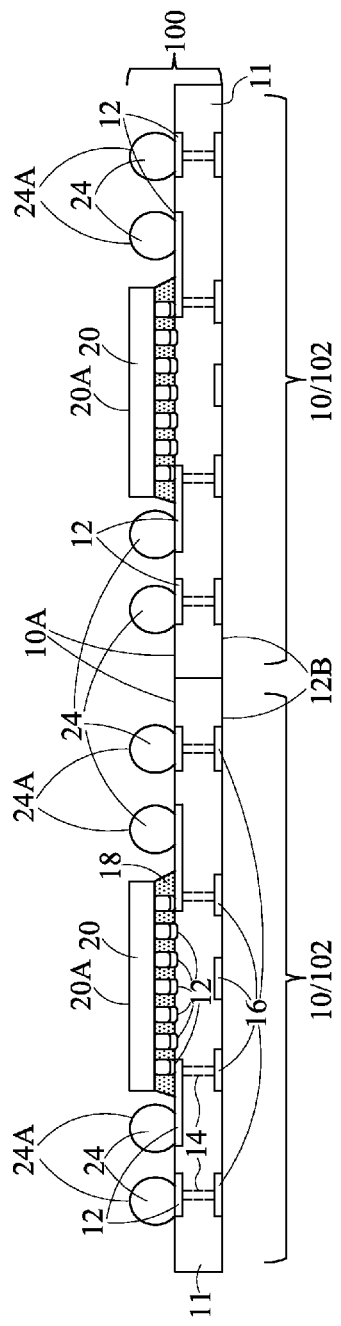
FIGS. 1 through 8 are cross-sectional views of intermediate stages in the manufacturing of a Package-on-Package (PoP) structure in accordance with some exemplary embodiments.

Referring to FIG. 1, package components 10 are provided. Package components 10 may be comprised in package component 100, which comprises a plurality of package components 10. In some embodiments, package components 10 are package substrates. Hence, throughout the description, package components 10 are referred to as package substrates, although they may be another type of package components. Accordingly, package component 100 may be package substrate strip. In alternative embodiments, package components 10 are interposers.

In some embodiments, package substrates 10 comprise substrates 11 that are formed of a semiconductor material such as silicon. Alternatively, substrates 11 are formed of a dielectric material. Substrates 11 may also be laminate substrates which include laminated dielectric films. Package substrates 10 are configured to electrically couple connectors 12 on first surface 10A to conductive features 16 on second surface 10B, wherein surfaces 10A and 10B are opposite surfaces of package substrates 10. Conductive features 16 may be metal pads, for example. Package substrates 10 may include metal lines/vias 14 therein. Alternatively, features 14 comprise through-vias penetrating through substrates 11.

Package components 20 are bonded to package substrates 10 through electrical connectors 12. Package components 20 may be dies, and hence are alternatively referred to as dies 20 hereinafter, although they may also be another type of package component such as packages. Dies 20 may be device dies comprising integrated circuit devices (not shown) such as transistors, capacitors, inductors, resistors, and the like. The bonding of dies 20 to connectors 12 may be a solder bonding or a direct metal-to-metal bonding (such as copper-to-copper bonding). Underfill 18 may be dispensed into the gap between dies 20 and package substrates 10 in some embodiments. In alternative embodiments, no underfill is dispensed into the gap between dies 20 and package substrates 10. Throughout the description, package substrates 10, dies 20, and solder balls 24 are in combination referred to as bottom packages 102.

Solder balls 24 are formed on the top surface of package substrates 10. Solder balls 24 may be electrically coupled to connectors 12 and conductive features 16. In accordance with some embodiments, solder balls 24 are placed on package substrates 10, followed by a reflow step to join solder balls 24 with package substrates 10. Accordingly, solder balls 24 have round surfaces. In some embodiments, top ends 24A of solder balls 24 are higher than top surfaces 20A of dies 20. In alternative embodiments, top ends 24A of solder balls 24 are substantially level with, or lower than, top surfaces 20A of dies 20.

Figure 2:
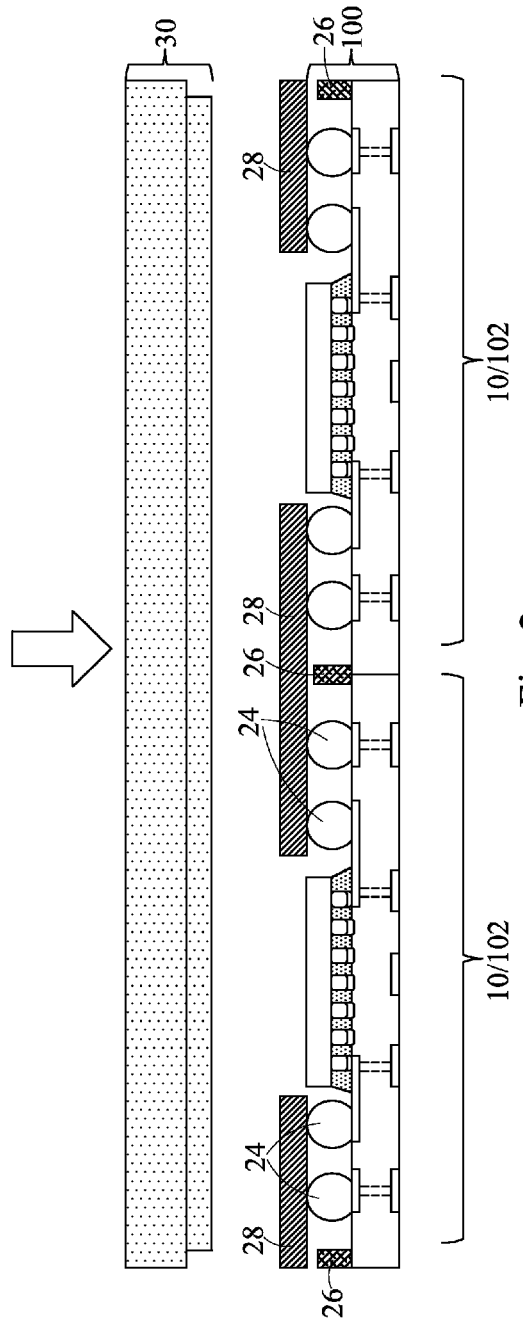

Referring to FIG. 2, spacer 26 is placed on package substrate strip 100. Although spacer 26 is illustrated as including discrete portions, the illustrated discrete portions may be portions of an integrated spacer. In some embodiments, spacer 26 has a top-view shape of a grid, with dies 20 aligned to the grid openings of the grid. Also, solder balls 24 are also aligned to the grid openings of the grid. The top ends of spacer 26 are lower than the top ends of solder balls 24.

As also illustrated in FIG. 2, rigid board 28 is placed over, and aligned to, solder balls 24. In some embodiments, rigid board 28 comprises a rigid material such as metal, ceramic, or the like. Furthermore, rigid board 28 may be formed of a thermal conductive material. For example, rigid board 28 may be formed of stainless steel. Similar to spacer 26, although rigid board 28 is illustrated as including discrete portions, the illustrated discrete portions may be portions of an integrated board. In some embodiments, rigid board 28 has a top view shape of a grid, with dies 20 aligned to the grid openings in the grid. Also, rigid board 28 comprises portions overlapping spacer 26. The bottom surface of rigid board 28 is flat (co-planar).

Coin head 30 is placed over rigid board 28. In some embodiments, coin head 30 has a top-view size similar to the top-view size of rigid board 28, and has a flat bottom surface. Coin head 30 is connected to a mechanism (not shown) that is configured to drive coin head 30 down to press rigid board 28. In some embodiments, coin head 30 is configured to heat rigid board 28. For example, coin head 30 may include an electrical coil (not shown) therein.

Figure 3:
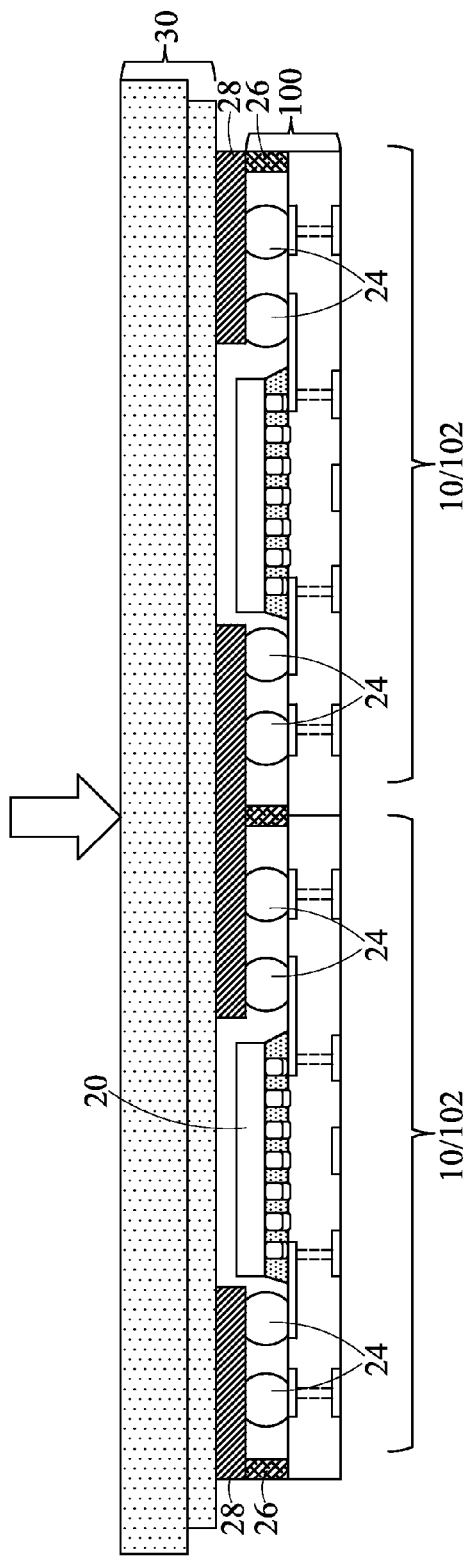

Referring to FIG. 3, coin head 30 is operated to press rigid board 28 down, so that rigid board 28 presses, and flattens the top surfaces of solder balls 24. The action of pressing and flattening the top surfaces of solder balls 24 is referred to as "coining" solder balls 24. In some embodiments, during the time period rigid board 28 is pressed, coin head 30 heats rigid board 28, which further heats solder balls 24. The resulting temperature of solder balls 24 is higher than the room temperature (about 21° C. to about 25° C., for example), and lower than the melting temperature of solder balls 24. In some exemplary embodiments, the temperature of solder balls 24 is between about 50° C. and about 150° C. during the coining process. In alternative embodiments, the heating of solder balls 24 is performed by heating package substrates 10 from bottom.

With the heating of solder balls 24, the required force needed to coin solder balls 24 is reduced. With the pressing-down of coin head 30, the height of solder balls 24 is reduced, and rigid board 28 is lowered, until rigid board 28 lands on spacer 26, at which time, the coining may be stopped. Spacer 26 thus acts as the stopper of the coining. Furthermore, the thickness of spacer 26 defines the resulting height of solder balls 24. Spacer 26, rigid board 28, and coin head 30 may then be removed. The resulting bottom packages 102 are illustrated in FIG. 4.

Figure 4:
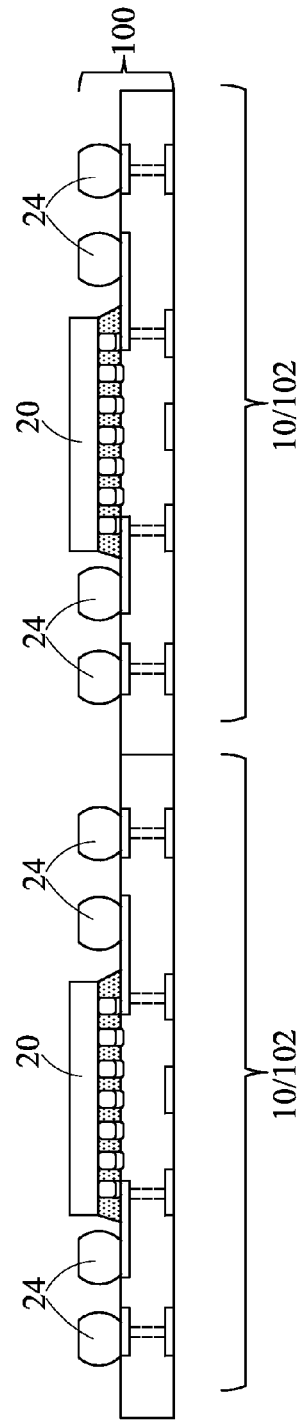

After the coining, as illustrated in FIG. 4, solder balls 24 have the cross-sectional view of barrels, and have substantially flat top surfaces and substantially flat bottom surfaces. Furthermore, the middle sections of solder balls 24 have diameters greater than the diameters of the top surfaces and the bottom surfaces.

Figure 5:
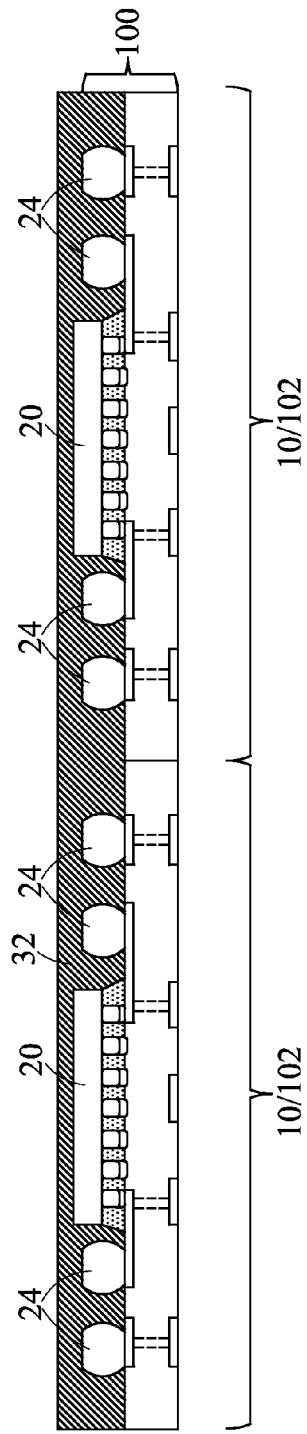

Referring to FIG. 5, molding material 32 is molded on dies 20 and package substrates 10, and is then cured. In some exemplary embodiments, molding material 32 comprises a polymer, which may be a molding compound, an underfill, a Molding Underfill (MUF), or the like. Solder balls 24 are buried in molding material 32.

Figure 6A:
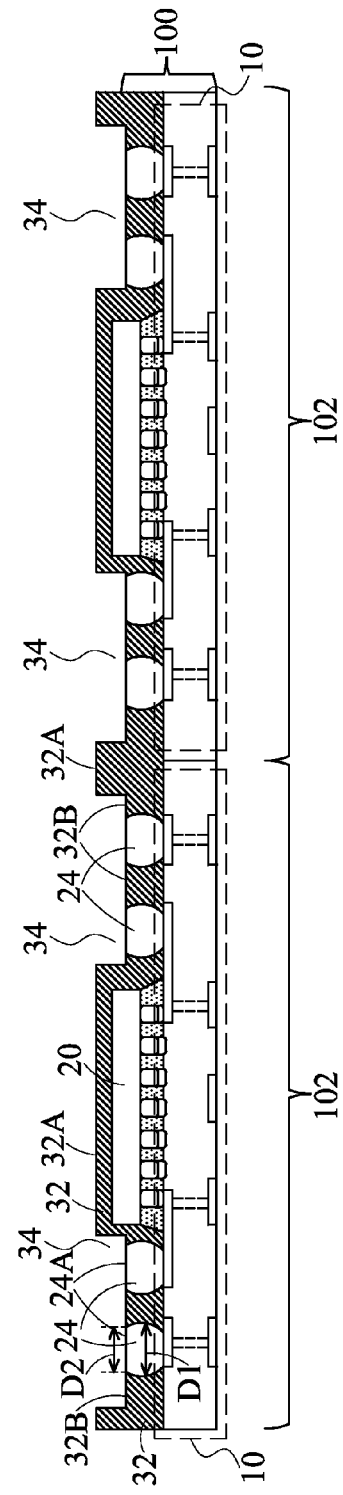

FIG. 6A illustrates the laser trimming step to remove the portions of molding material 32 that covers solder balls 24. The energy of the laser used in the laser trimming process is adjusted, so that molding material 32 is trimmed when exposed to the laser, while solder balls 24 are not removed even exposed to the laser. As shown in FIG. 6A, as a result of the laser trimming, trenches 34 are formed, with solder balls 24 exposed to trenches 34. The resulting molding material 32 includes surfaces 32A outside of trenches 34, and surfaces 32B inside trenches 34. Surfaces 32B are lower than surfaces 32A. In addition, top surfaces 24A of solder balls 24 may be substantially level with or higher than top surfaces 32B of molding material 32.

Solder balls 24 have maximum diameters D1, which are greater than the diameter D2 of the top surfaces 24A. Since solder balls 24 have the barrel shapes, in the upper half of each of solder balls 24, the diameters of solder balls increase with the reduction in height. In some embodiments, the laser trimming process is controlled, so that the portions of solder balls 24 over surfaces 32B have diameters smaller than maximum diameter D1. Alternatively stated, the laser trimming may be controlled, so that the top surfaces 32B of molding material 32 are not lowered to the level at which solder balls 24 have the maximum diameter D1.

Figure 6C:
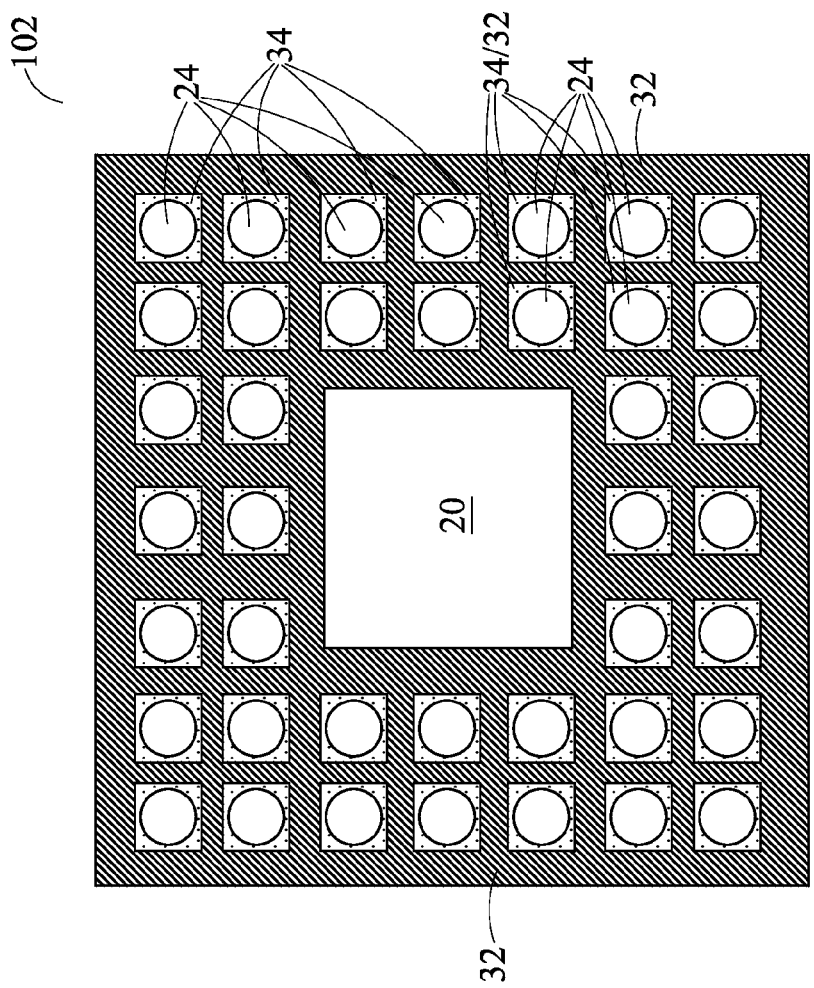

The laser trimming may have various types. FIGS. 6B and 6C illustrate two possible types of trimming. FIGS. 6B and 6C are top views of one of bottom packages 102. Referring to FIG. 6B, in some embodiments, trenches 34 in the same bottom package 102 are interconnected to form large trenches. Furthermore, all trenches 34 in the same bottom packages 102 may be interconnected to form a trench ring, as shown in FIG. 6B. The trench ring may encircle die 20. The cross-sectional view of bottom package 102 is similar to what is shown in FIG. 6A.

FIG. 6C illustrates another type of trimming, in which each of solder balls 24 is exposed through a discrete trench 34, and the discrete trenches 34 are disconnected from each other. In the illustrated example, trenches 34 have square top view shapes. In alternative embodiments, trenches 34 may have other types of top view shapes including, and not limited to, circular shapes, hexagon shapes, octagon shapes, and the like.

Figure 7:
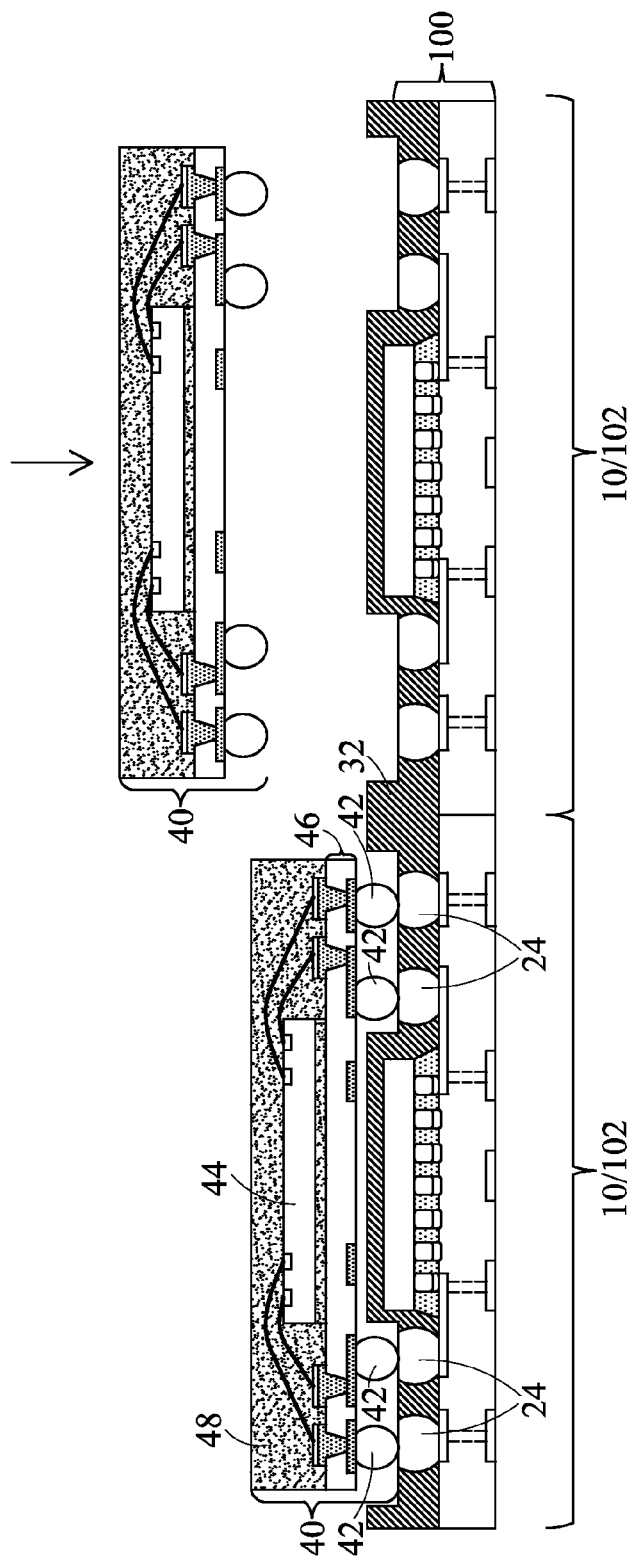

Referring to FIG. 7, top packages 40 are placed onto bottom packages 102. Solder balls 42 of top packages 40 are aligned to, and are placed on, solder balls 24. Each of top packages 40 may include device die 44, and package substrate 46, on which device die 44 is bonded. Furthermore, molding material 48 may be molded on device die 44.

Figure 8:
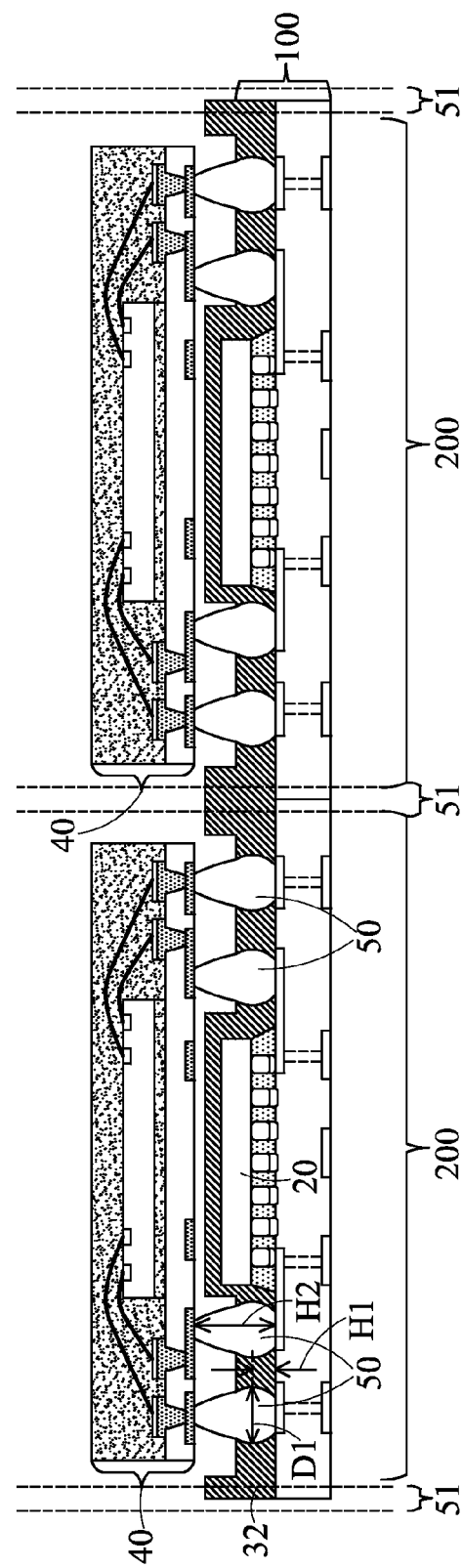

Next, as shown in FIG. 8, a reflow is performed, so that top packages 40 are bonded to package substrates 10. After the reflow, solder balls 24 and 42 (FIG. 7) are molten and joined, and the resulting solder regions are referred to as solder regions 50 in FIG. 8. In some embodiments, solder regions 50 have a profile in which the lower halves are wider than the respective upper halves. For example, the maximum diameter D1 is in the lower half of each of solder regions 50. In some embodiments, the maximum diameter D1 of solder regions 50 occur at height H1, which is close to a quarter of the over height H2 of solder regions 50. After the reflow, an underfill (not shown) may be disposed between top packages 40 and bottom packages 102. A sawing step may be performed along scribe lines 51. The structure in FIG. 8 is hence sawed into a plurality of packages 200.

FIGS. 9 through 13 illustrate the cross-sectional views of intermediate stages in the formation of a PoP structure in accordance with alternative embodiments. Unless specified otherwise, the materials and formation methods of the components in these embodiments are essentially the same as the like components, which are denoted by like reference numerals in the embodiments shown in FIGS. 1 through 8. The details regarding the formation process and the materials of the components shown in FIGS. 9 through 13 (and in the embodiments shown in FIGS. 14 through 23) may thus be found in the discussion of the embodiments shown in FIGS. 1 through 8.

Figure 9:
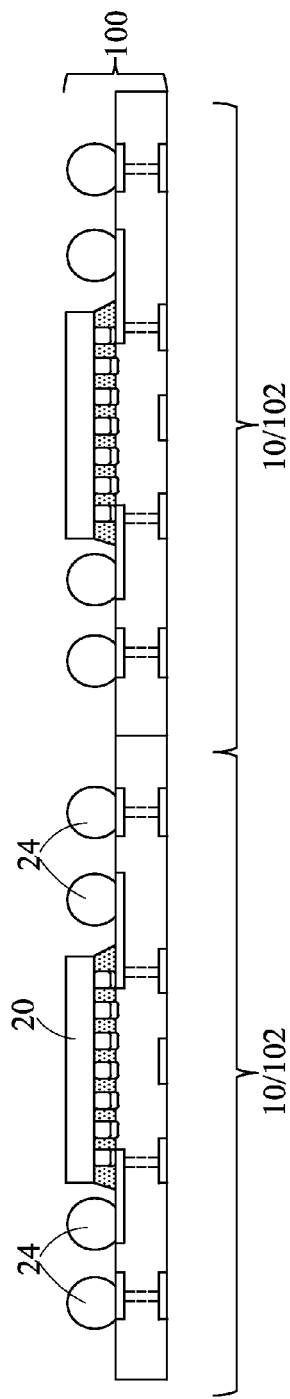

Referring to FIG. 9, initial packages 102 are provided. The bottom packages 102 are essentially the same as shown in FIG. 1, and hence the details are not discussed herein. Next, referring to FIG. 10, mold chase 52 is placed on bottom packages 102, and is pressed against solder balls 24. Mold chase 52 may be formed of stainless steel, ceramics, copper, aluminum, or other type of rigid materials. In some embodiments, mold chase 52 includes pins 52A that extend down to contact, and to press on, solder balls 24. Pins 52A may be identical to each other. Pins 52A are designed to align to solder balls 24, so that each of solder balls 24 corresponds to, and may be aligned to, one of overlying pins 52A. In some embodiments, pins 52A have vertical sidewalls with the top portions and the bottom portions having the same shape and same widths. In alternative embodiments, pins 52A have a tapered profile, with the lower portions of pins 52A have horizontal dimensions (width) smaller than the horizontal dimensions of the upper portions of pins 52A. The number of pins 52A may be equal to the total number of solder balls 24. The bottom surfaces of pins 52A are flat. Mold chase 52 further includes body 52B, to which pins 52A are attached.

Figure 10:
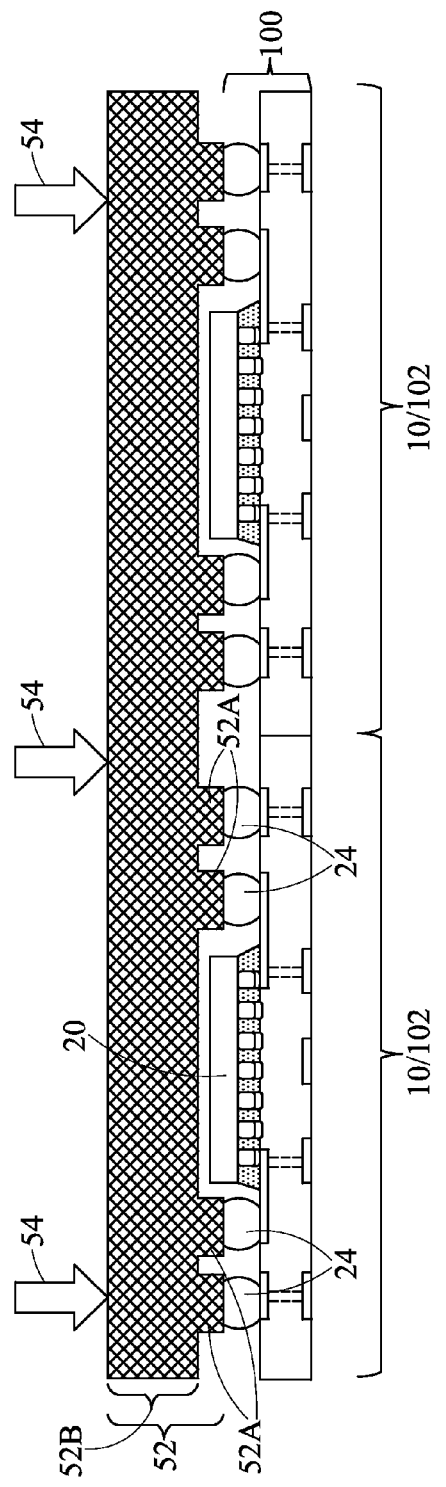

As also shown in FIG. 10, force 54 is applied to press mold chase 52 down. Accordingly, solder balls 24 are coined, and the top surfaces of solder balls 24 are flattened. The resulting solder balls 24 may have essentially the same profile presented in the embodiments shown in FIG. 4. During the coining of solder balls 24, solder balls 24 may be heated, for example, to a temperature between about 50° C. and about 150° C.

Next, referring to FIG. 11, with mold chase 52 remain to be on bottom packages 102, polymer 32 is injected into the space between mold chase 52 and bottom packages 102. When injected, polymer 32 is in a liquid form and is able to flow. Molding compound 32 may be in contact with the top surface and the edges of dies 20, and may be in contact with pins 52A, solder balls 24, and the top surfaces of package substrates 10. The top surface 32A of molding compound 32 may be higher than top surfaces 20A of dies 20, and dies 20 may be fully encapsulated in molding compound 32. Molding compound 32 is then cured, for example, in a thermal curing process, although other curing methods may be used. Mold chase 52 may then be taken away, and the molding process is finished.

FIG. 12 illustrates bottom packages 102 after mold chase 52 is removed. Trenches 34 are left where pins 52A (FIG. 11) were located, and the top surfaces of solder balls 24 are exposed. Trenches 34 may have sizes and shapes substantially the same as each other. The top view of trenches 34 may be found to be similar to what is shown in FIG. 6C. In a subsequent step, as shown in FIG. 13, top packages 40 are bonded to bottom packages 102 through solder regions 50, which are formed by reflowing solder balls 24 (FIG. 12) and the solder balls in top packages 40. The profile of solder regions 50 may be essentially the same as in FIG. 8, and is not repeated in detail herein. A sawing step may then be performed along scribe lines 51, so that the structure shown in FIG. 13 is sawed into a plurality of packages 200. Alternatively, the sawing may be performed after a subsequent filling of a molding material.

FIGS. 14 through 18 illustrate the cross-sectional views of intermediate stages in the formation of a PoP structure in accordance with yet alternative embodiments. These embodiments are similar to the embodiments in FIGS. 9 through 13, except that instead of having pins 52A corresponding to solder balls 42 with a one-to-one correspondence, all solder balls 24 in each of package substrates 10 is coined by the same pin, which form a ring. Referring to FIG. 14, bottom packages 102 are provided. The bottom packages 102 are essentially the same as shown in FIG. 1, and hence the details are not repeated herein.

Figure 15:
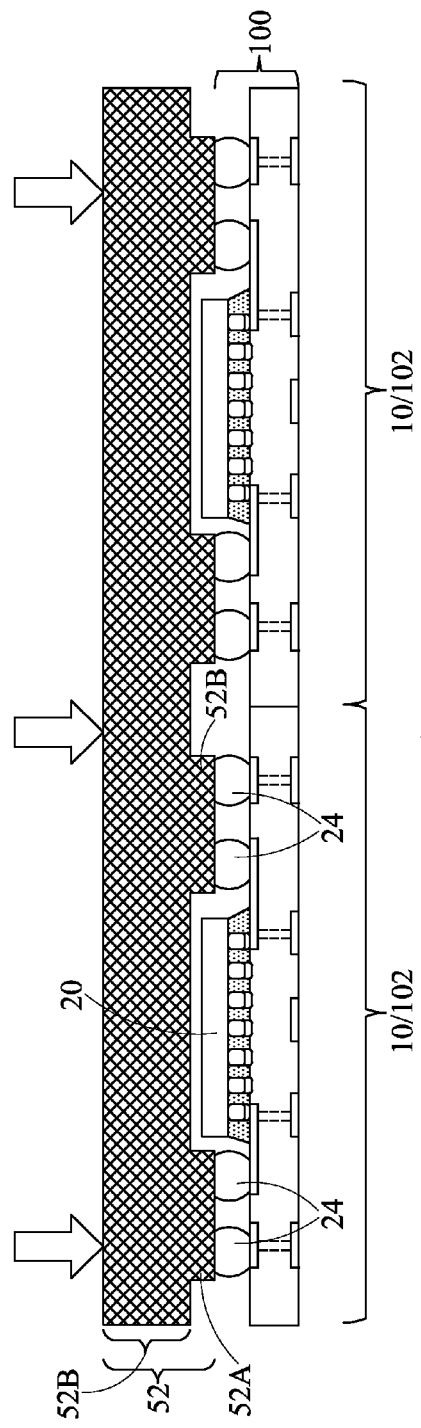

As shown in FIG. 15, mold chase 52 is pressed on solder balls 24. Mold chase 52 includes body 52B, and a plurality of pin rings 52A, which are physically disconnected from each other. Each of the pin rings 52A overlaps all solder balls 24 of one of bottom packages 102. The bottom surfaces of all of pin rings 52A are co-planar. Mold chase 52 is pressed down, so that solder balls 24 are coined to have barrel shapes.

Figure 16:
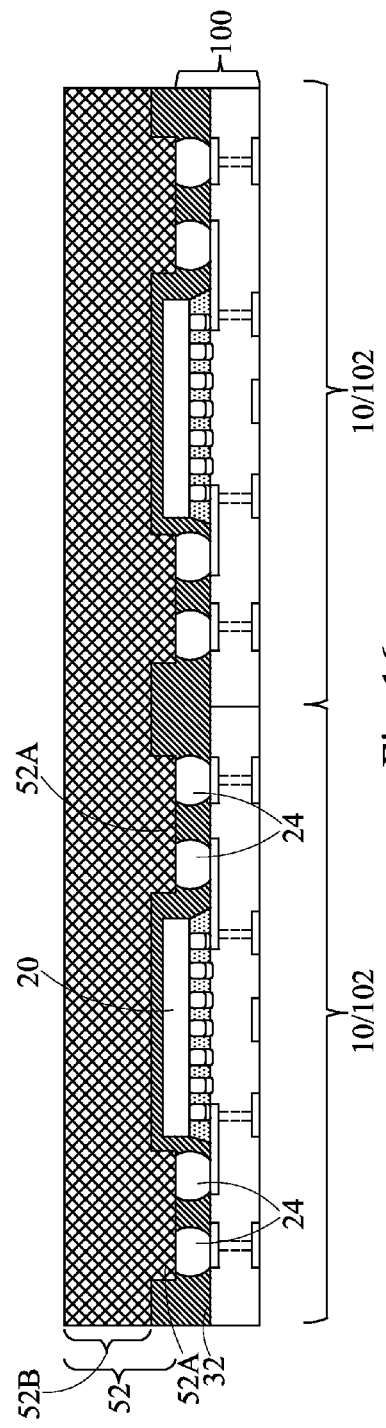
Figure 17:
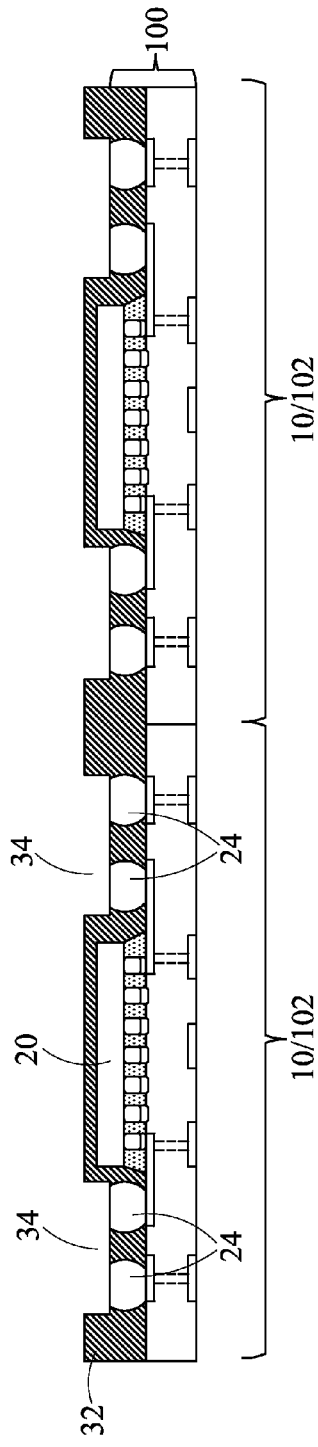
Figure 18:
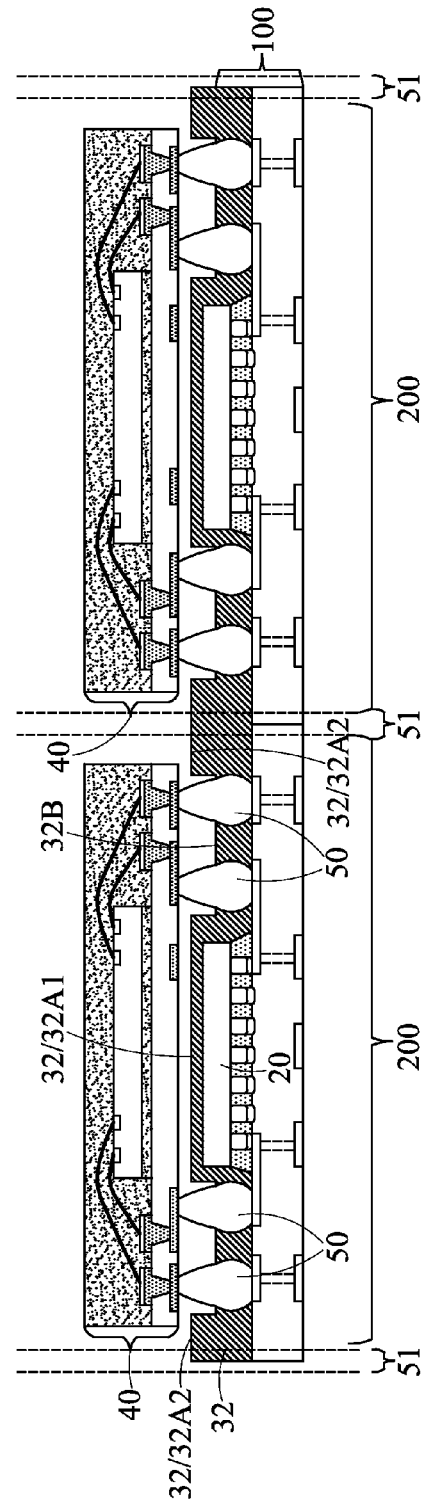

Next, referring to FIG. 16, molding material 32 is injected into the space between mold chase 52 and bottom packages 102, and is cured. Mold chase 52 is then taken away, as shown in FIG. 17, the resulting trenches 34 forms a plurality of trench rings, each in one of bottom packages 102. Furthermore, each of trenches 34 encircles the respective die 20 that is in the same bottom packages 102. The top view of these embodiments may be essentially the same as in FIG. 6B. FIG. 18 illustrates the bonding of top packages 40 to bottom packages 102.

FIGS. 19 through 23 illustrate the cross-sectional views of intermediate stages in the formation of a PoP structure in accordance with yet alternative embodiments. These embodiments are similar to the embodiments in FIGS. 14 through 18, except that pin rings 52A (FIG. 20) overlying each of bottom packages 102 join each other to form a pin grid.

Figure 19:
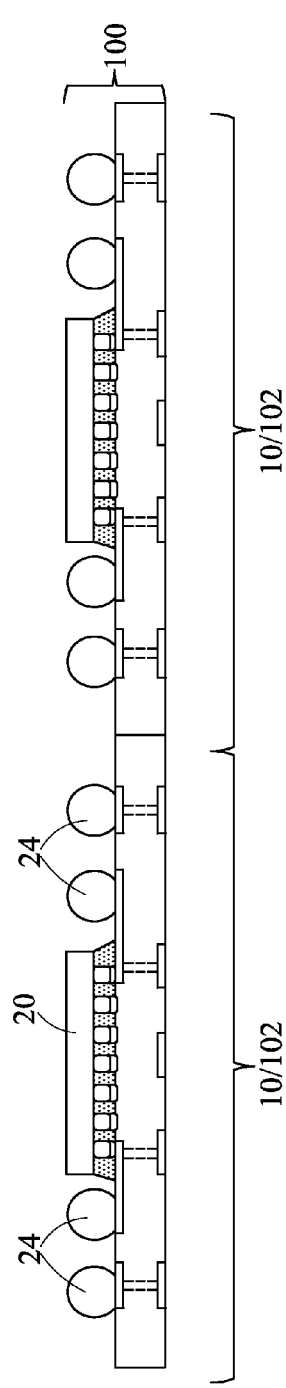
FIGS. 19 through 23 are cross-sectional views of intermediate stages in the manufacturing of a PoP structure in accordance with yet alternative embodiments, wherein a terrace-type mold chase is used to coin solder balls.
Figure 20:
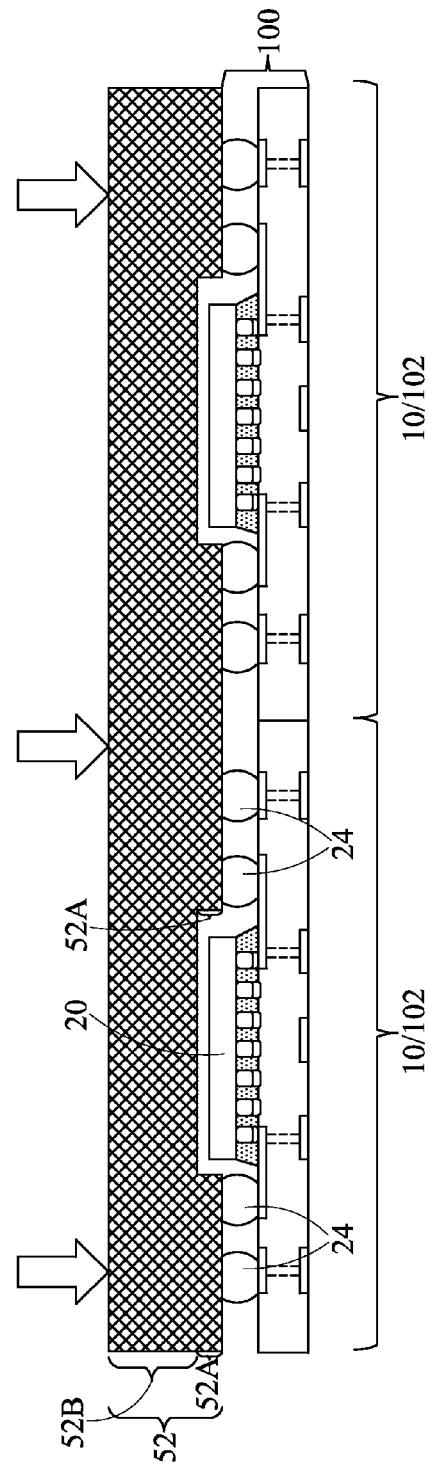
Figure 21:
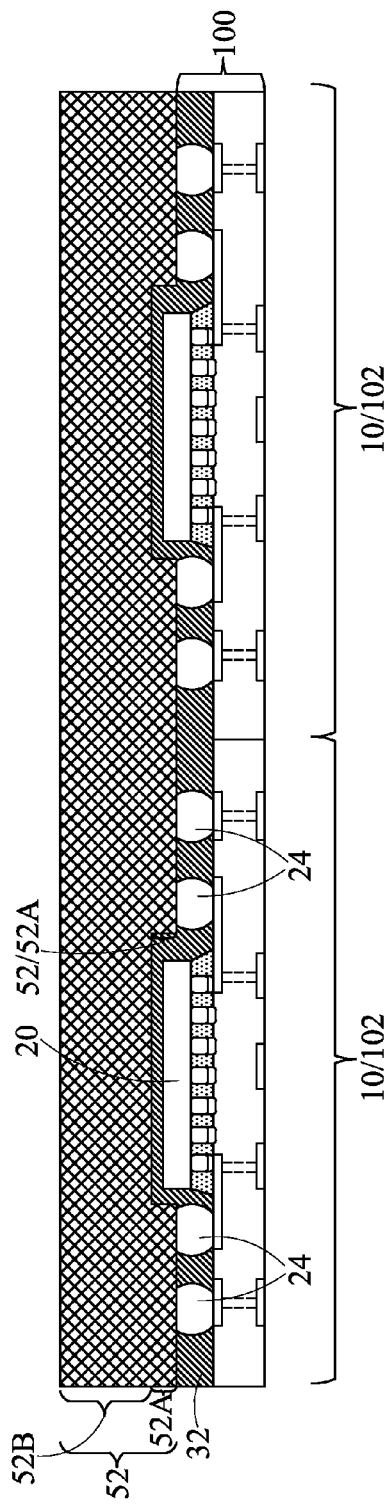
Figure 22:
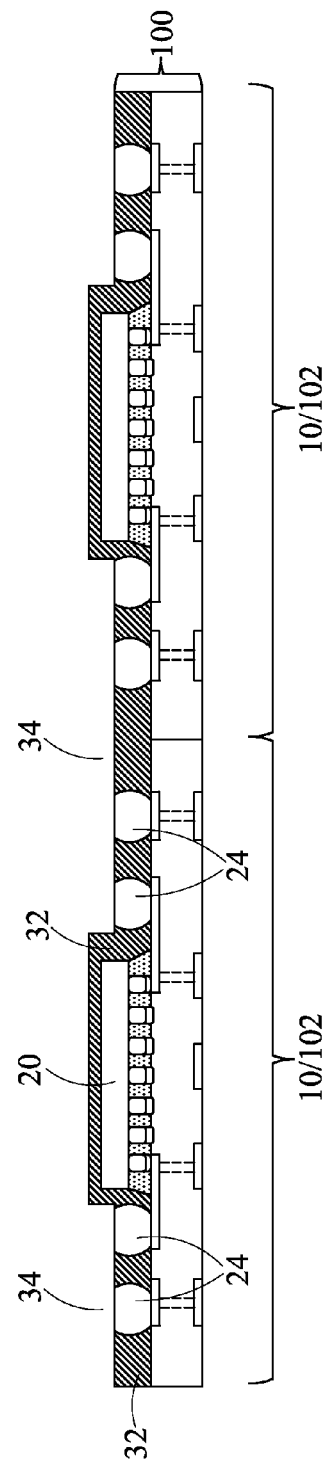

Referring to FIG. 19, an initial package is provided. The initial package is essentially the same as shown in FIG. 1, and hence the details are not discussed herein. Next, as shown in FIG. 20, mold chase 52 is placed to coin solder balls 24. Mold chase 52 includes body 52B, and a mold grid 52A underlying and attached to body 52B. Mold grid 52A may be considered as the pin rings 52A in FIG. 15 merge with each other. The grid lines of mold grid 52A overlap all solder balls 24 of all bottom packages 102. The grid openings of mold grid 52A are aligned to dies 20. A grid line of mold grid 52A may include a first half overlapping a first one of bottom packages 102, and a second half overlapping a second half of a second one of bottom packages 102. As also shown in FIG. 20, mold chase 52 is pressed down, so that solder balls 24 are coined. Next, referring to FIG. 21, molding material 32 is injected into the space between mold chase 52 and bottom packages 102, and is cured. Mold chase 52 is then taken away, as shown in FIG. 22.

Figure 23:
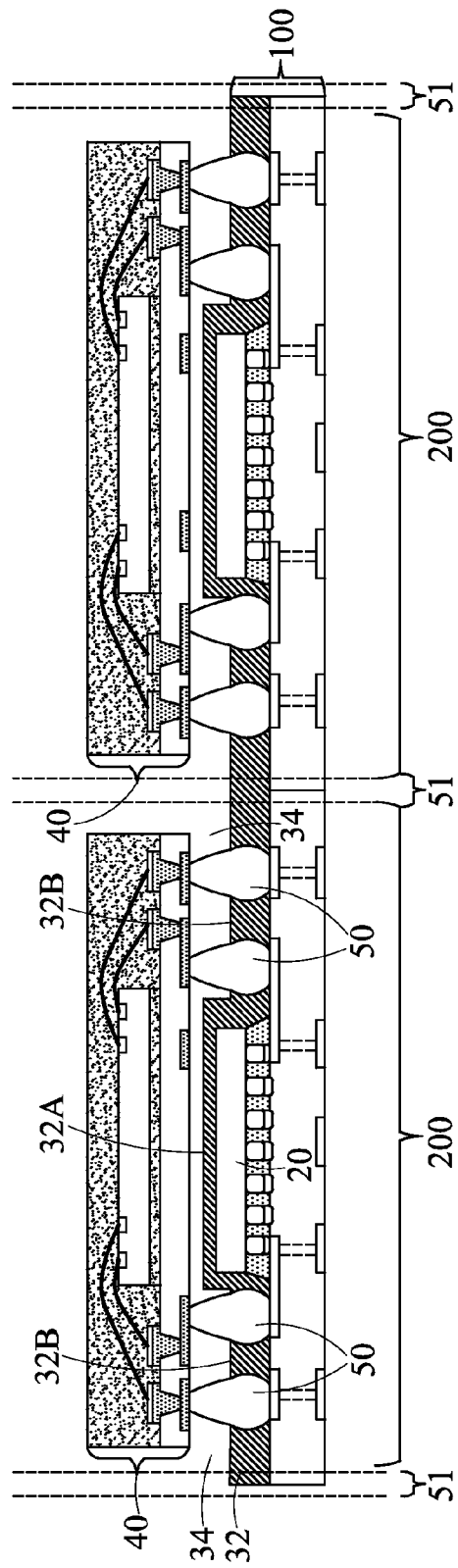

FIG. 23 illustrates the bonding of top packages 40 to bottom packages 102. A sawing step may then be performed along scribe lines 51 to saw the structure in FIG. 23 into a plurality of packages 200. Alternatively, the sawing may be performed after a subsequent filling of a molding material. Packages 200 in FIG. 23 are similar to the packages in FIG. 18, except that in FIG. 23, each of packages 200 includes a portion of molding material 32 overlapping die 20, with this portion of molding material 32 having top surface 32A. All remaining top surfaces 32B of molding material 32 are lower than top surface 32A. Furthermore, the top surface 32B, which is the top surface of molding material 32 in trench 34, extends all the way to the edge of package 200. In FIG. 18, however, top surface 32B in each of packages 200 forms a ring, and does not extend to the edge of the respective package 200. Alternatively stated, in FIG. 18, trench 34 (and top surface 32B) is between a first top surface 32A (denoted as 32A1) that is directly over die 20, and a second top surface 32A (denoted as 32A2) that extends to the edge of package 200.

In the embodiments of the present disclosure, by coining solder balls, the top surface of solder balls have increased areas. Accordingly, the process window for aligning the solder balls in the top packages to the bottom packages is enlarged. With solder balls being coined, the heights of the solder balls in the final PoP packages are reduced.

In accordance with some embodiments, a method includes coining solder balls of a bottom package, wherein top surfaces of the solder balls are flattened after the step of coining. The solder balls are molded in a molding material. The top surfaces of the solder balls are through trenches in the molding material.

In accordance with other embodiments, a method includes placing a spacer on a package substrate of a bottom package, and coining a plurality of solder balls of the package substrate using a co-planar surface that contacts the plurality of solder balls. Top surfaces of the plurality of solder balls are flattened by the co-planar surface. The step of coining is stopped after the co-planar surface is stopped by the spacer. The method further includes removing the spacer, molding the plurality of solder balls in a molding material, and removing a top portion of the molding material over the plurality of solder balls to reveal the plurality of solder balls.

In accordance with yet other embodiments, a package includes a bottom package, which includes a package substrate, and a die over and bonded to the package substrate. A plurality of solder regions is disposed over and bonded to a top surface of the package substrate. A molding material is over the package substrate and molding the solder regions. The molding material has a first top surface overlapping the die, and a trench extending from the first top surface into the molding material, wherein the plurality of solder regions is exposed to the trench.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    placing a spacer on a package substrate of a bottom package;
    coining a plurality of solder balls of the package substrate using a co-planar surface that contacts the plurality of solder balls, wherein top surfaces of the plurality of solder balls are flattened by the co-planar surface, and wherein the step of coining is stopped after the co-planar surface is stopped by the spacer;
    removing the spacer;
    molding the plurality of solder balls in a molding material; and
    removing a top portion of the molding material over the plurality of solder balls to reveal the plurality of solder balls.

2. The method of claim 1, wherein the step of removing the top portion of the molding material comprises a laser trimming.

3. The method of claim 1, wherein after the step of removing the top portion of the molding material, a continuous trench is formed, with the plurality of solder balls exposed through the continuous trench.

4. The method of claim 3, wherein the trench forms a ring, with a die of the bottom package encircled by the ring.

5. The method of claim 1, wherein after the step of removing the top portion of the molding material, a plurality of discrete trenches is formed, with each of the plurality of solder balls exposed through one of the plurality of discrete trenches.

6. The method of claim 1 further comprising bonding a top package to the bottom package, wherein the top package is bonded to the plurality of solder balls.

7. The method of claim 1, wherein during the coining, the plurality of solder balls is heated thorough heating a rigid board.

8. A method comprising:
    placing a rigid board over a plurality of solder balls, wherein the rigid board comprises first portions overlapping the plurality of solder balls, and a second portion overlapping a spacer;
    coining the plurality of solder balls at a top surface of a package substrate by pressing on the rigid board, wherein top surfaces of the plurality of solder balls are flattened, wherein a device die is bonded to the package substrate, and the rigid board has an opening aligned with the device die and allowing the device die to extend into the opening during the coining;
    molding the plurality of solder balls in a molding material; and
    after the molding, bonding a package component to the package substrate through the plurality of solder balls.

9. The method of claim 8, wherein the plurality of solder balls is buried in the molding material, and the method further comprises removing a top portion of the molding material over the plurality of solder balls to reveal the plurality of solder balls.

10. The method of claim 9, wherein the removing the top portion of the molding material is performed using laser.

11. The method of claim 10, wherein the removed top portion of the molding material forms a ring encircling the device die.

12. The method of claim 8, wherein the coining comprises:
    using a coin head to press the rigid board to flatten the top surfaces of the plurality of solder balls.

13. The method of claim 12 further comprises:
    placing a spacer over a top surface of the package substrate, wherein the coining is stopped when the rigid board is stopped by the spacer; and
    before the molding, removing the spacer from the top surface of the package substrate.

14. The method of claim 8, wherein the rigid board has a flat bottom surface.

15. The method of claim 8, wherein during the coining, the solder balls are heated.

16. A method comprising:
    placing a spacer over a top surface of a package substrate;
    placing a rigid board over a plurality of solder balls, wherein the rigid board comprises first portions overlapping the plurality of solder balls, and a second portion overlapping the spacer;
    coining the plurality of solder balls at a top surface of the package substrate by pressing on the rigid board using a coin head, wherein top surfaces of the plurality of solder balls are flattened by the rigid board, and the coining is stopped when the rigid board is stopped by the spacer;
    removing the spacer from the top surface of the package substrate;
    after the spacer is removed, molding the plurality of solder balls in a molding material; and
    after the molding, bonding a package component to the package substrate through the plurality of solder balls.

17. The method of claim 16, wherein the plurality of solder balls is buried in the molding material, and the method further comprises removing a top portion of the molding material over the plurality of solder balls to reveal the plurality of solder balls.

18. The method of claim 17, wherein the removing the top portion of the molding material is performed using laser.

19. The method of claim 16, wherein a device die is bonded to the package substrate, and the rigid board has an opening aligned with the device die.

20. The method of claim 16, wherein during the coining, the plurality of solder balls is heated.

\* \* \* \* \*